United States Patent [19]
Kelly et al.

[11] Patent Number: 6,011,319
[45] Date of Patent: Jan. 4, 2000

[54] INTEGRATED CIRCUIT ASSEMBLY FOR POWER AND ELECTRONICS

[75] Inventors: Sean Michael Kelly, Williamsville, N.Y.; Kevin Joseph Hawes, Greentown; David Jay Vess, Kokomo, both of Ind.

[73] Assignee: Delphi Technologies, Inc., Troy, Mich.

[21] Appl. No.: 09/093,992

[22] Filed: Jun. 9, 1998

[51] Int. Cl.[7] .................................................... H05K 1/14
[52] U.S. Cl. ...................... 307/10.1; 439/76.1; 439/76.2; 701/36
[58] Field of Search .................. 307/10.1, 147; 439/76.2, 76.1; 361/679, 728, 641; 701/36, 48

[56] References Cited

U.S. PATENT DOCUMENTS

| | | | |
|---|---|---|---|
| 5,040,097 | 8/1991 | Stribel | 439/76.2 |
| 5,198,696 | 3/1993 | Dennis | 307/10.1 |
| 5,283,712 | 2/1994 | Michihira et al. | 439/76.1 |
| 5,428,535 | 6/1995 | Katsumata et al. | 701/36 |
| 5,581,130 | 12/1996 | Boucheron . | |
| 5,755,580 | 5/1998 | Chen | 439/76.2 |

*Primary Examiner*—Albert W. Paladini
*Attorney, Agent, or Firm*—Jimmy L. Funke

[57] ABSTRACT

An automotive circuit package combines electronic control functions and power function on a single circuit board substrate. Electronic components including signal level terminals are in one section of the substrate and an array of power terminals are in a second section of the substrate but sharing some common circuit paths carrying control signals. Supplemental conductors in the second section are selectively connected to power terminals to carry high current levels. Each terminal is a through access terminal for directly connecting conductors on the substrate, wiring harness connectors on one side of the substrate and fuses and relays on the other side of the substrate. In one embodiment the terminals have a male portion extending from one side of the substrate and a female portion on the other side. In another embodiment male and female portions are on the same side of the substrate and apertures in the substrate allow plugging into the female portions from the other side.

15 Claims, 5 Drawing Sheets

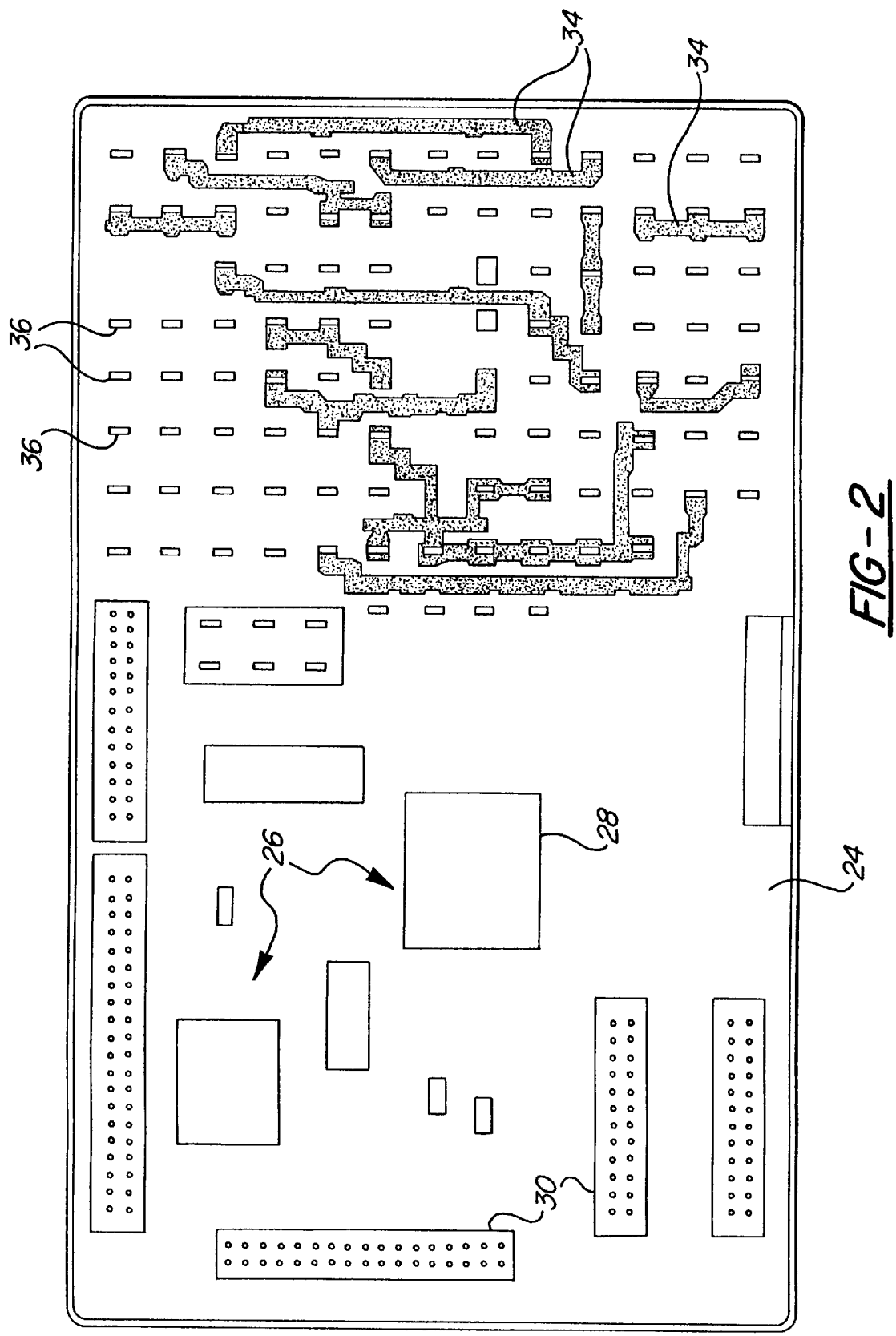

INTEGRATED CIRCUIT ASSEMBLY FOR POWER AND ELECTRONICS

FIELD OF THE INVENTION

This invention relates to an automotive control circuit assembly and particularly to a compact assembly having power and electronic circuits integrated on a single substrate.

BACKGROUND OF THE INVENTION

Commonly automotive vehicles have had an electrical system for controlling a variety of vehicle functions comprising an electronics module in a protective housing connected by a harness to a separate bussed electrical center. The electronic module operates at signal level currents while the electrical center operates at higher power levels and is coupled to fuses, relays and devices capable of high current levels. Both components accept one or more harnesses from the vehicle with separate connectors. This arrangement is expensive, requires a large amount of packaging room in the vehicle, and has lower reliability due to the large number of wire connections.

Attempts to integrate the electronic and power functions into a single package have resulted in assemblies which have a package shape which is difficult to utilize in a vehicle, have a complex or an expensive connector between the two units, or requires a large amount of circuit board space for connectors. The U.S. Pat. No. 5,581,130 to Boucheron entitled "CIRCUIT BOARD FOR THE CONTROL AND/OR POWER SUPPLY OF ELECTRICAL FUNCTION DEVICES OF A VEHICLE" is one example of such an attempt. There a plurality of circuit boards are employed or, in a single board configuration, a large package size results due to the placement of connectors and devices on only one side of the package.

SUMMARY OF THE INVENTION

It is therefore an object of the invention to reduce the cost and complexity of combining the power and control functions in a single package. Another object is to reduce the size of the package.

A single circuit board substrate is used for both power and signal level functions. One section of the board is dedicated to electronics including small terminals for signal level I/O functions and one or more additional sections are dedicated to an array of larger terminals for connection to wiring harnesses, fuses and relays, or other pluggable devices. Ordinary printed circuit paths service both sections of the substrate but some supplementary power bus conductors interconnect selected large terminals to handle large currents in that region. The large terminals are arranged to permit wiring harness connection to one side of the substrate and fuse and relay connection to the other side, thus conserving substrate area.

In one embodiment, the large terminals each comprise a terminal extending through the substrate and soldered to a solder pad. One end of the terminal is a male blade and the other end is bifurcated to form a female connector. Either or both ends of the terminal may be connected to a harness or a power component. In another embodiment, a large terminal mounted on the substrate adjacent an aperture has a male blade portion extending from one side of the substrate and has an adjacent female portion on the same side of the substrate and aligned with the aperture to permit coupling with a male connector from the other side of the substrate.

BRIEF DESCRIPTION OF THE DRAWINGS

The above and other advantages of the invention will become more apparent from the following description taken in conjunction with the accompanying drawings wherein like references refer to like parts and wherein:

FIG. 2 is circuit board substrate housed within the module of FIG. 1;

DESCRIPTION OF THE INVENTION

Figure 1:
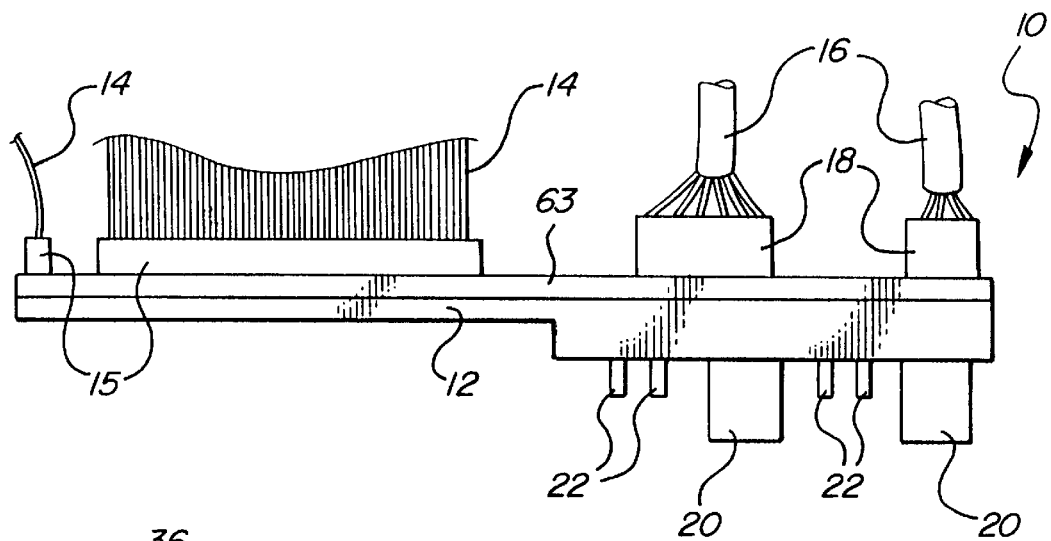
FIG. 1 is a side view of an integrated power and electronic module according to the invention.

Referring to FIG. 1, an integrated power and electronic module 10 contains circuitry for controlling a number of vehicle functions such as seat adjustment, power windows and instrument panel displays. To that end the module receives electronic signals from various parts of the vehicle and outputs control signals to effect some functions as well as controlled power to effect other functions. The module 10 includes a housing 12 and a cover 63, the housing 12 having in one region a plurality of circuit harnesses 14 (with connectors 15) which extend from the module to various portion of the vehicle to communicate electronic signals, and in another region a plurality of power harnesses 16 having connectors 18 extend from the module to a power supply and to vehicle components under control of the module 10. The harnesses 14 and 16 are connected to the same side of the module. Power components comprising relays 20 and fuses 22 are connected to the other side of the module 10 opposite the harnesses 16.

FIG. 2 depicts a circuit board substrate 24 housed within the housing 12. One section of the substrate, shown on the left, is devoted to electronics and contains electronic components 26 including a microprocessor 28, and headers or terminal arrays 30 for connecting signal level current to the harnesses 14 via connectors 15. A second section of the substrate, shown on the right, is the power section and contains an array of terminals 36 for high current conduction. The terminals are shown aligned in a regular pattern in parallel planes. Some terminals may instead be arranged in a non-continuous grid or a grid comprised of relay groupings. Such groupings include terminals in non-parallel planes to accommodate the footprint of European style ISO relays. In addition to normal printed circuit paths (not shown) which extend throughout both section of the substrate, supplemental conductors 34 selectively interconnect certain terminals 36. The normal circuit paths carry control signals to certain terminals connected to control windings of the relays 20 and the supplemental conductors 34 are coupled to the power terminals of the relays.

Figure 3:
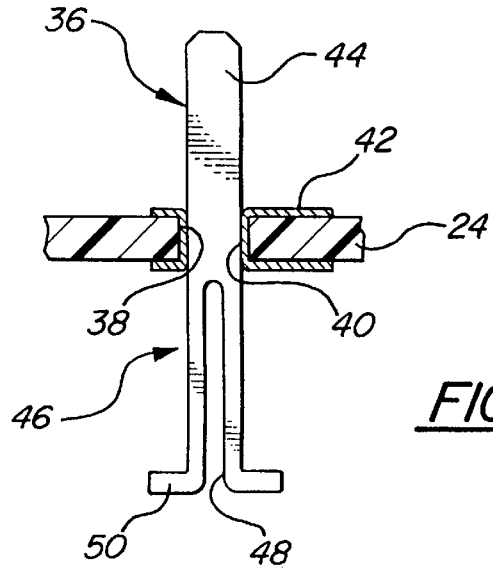
FIG. 3 is a side view of a through access terminal in a sectioned substrate portion according to one embodiment of the invention.

Each terminal 36 is a through access terminal; that is, a terminal which can directly connect a harness conductor and a power component as well as to a printed circuit conductor or a supplemental conductor. FIG. 3 shows one type of through access terminal 36 which is a flat elongated member having a rectangular cross section and is mounted in a rectangular or oval hole 38 of the printed circuit substrate 24 plated with a conductor 40 which in at least some cases is contiguous with a circuit pathway 42. One end 44 of the terminal 36 is a plain solid blade which is a male terminal portion and the other end 46 is bifurcated to define a slot 48 and is a female terminal portion. Each leg of the bifurcated portion has an out-turned foot or hook 50.

Figure 4:
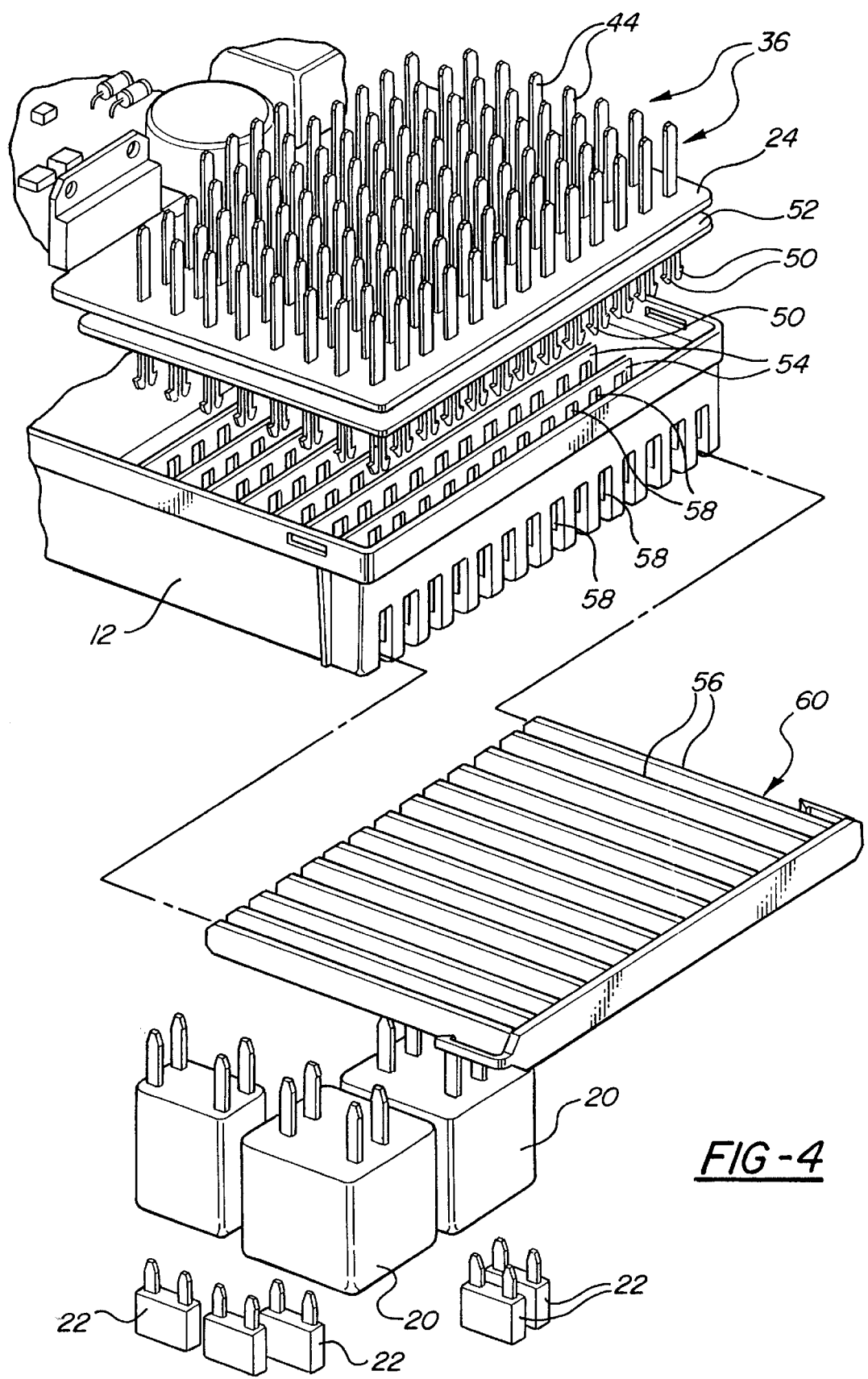
FIG. 4 is an exploded view of a portion of a module according to the one embodiment of the invention.

The exploded view of a module 10 shown in FIG. 4 shows a portion of the first section of substrate 24 containing the electronic components 26 and the second section which holds the large terminals 36. An optional carrier 52 is used to hold the terminals in place prior to assembly with the substrate and has no function after assembly. The housing 12 has a series of transverse retention webs 54 arranged for alignment between the rows of terminals 36. An array of apertures 58 in the webs 54 and in the end of the housing are aligned with the spaces between adjacent terminals and admit the teeth 56 of a retention comb 60.

Figure 5:
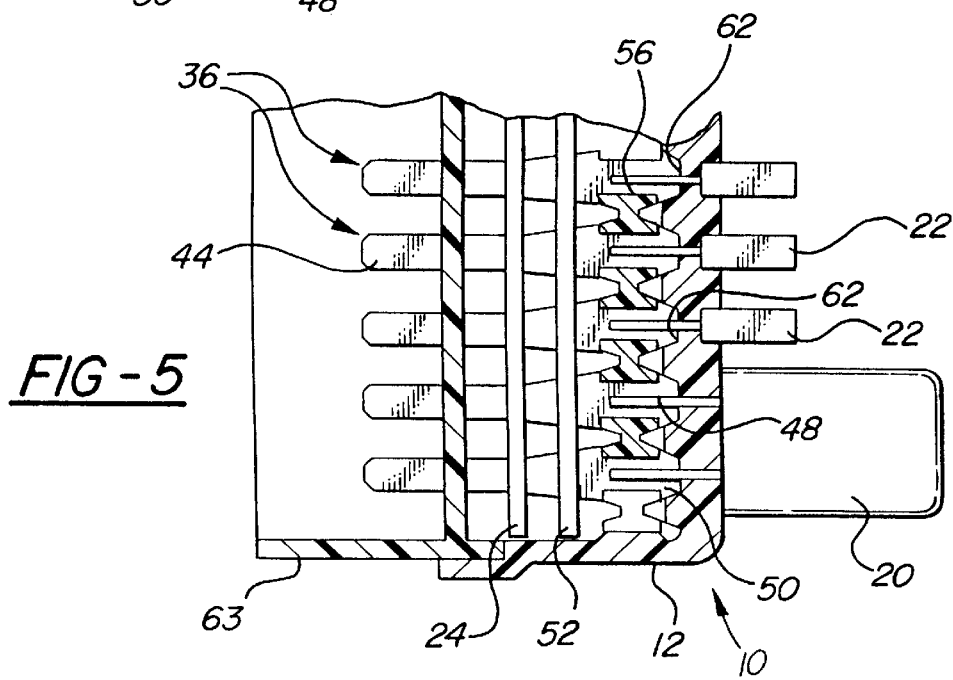
FIG. 5 is a cross section of a portion of the module assembly of FIG. 4.

After the substrate is mounted in the housing the comb is inserted into the housing so that the teeth 56 enter and snugly fill the apertures 58 and bear against the feet or hooks 50 of the terminals, entrapping the hooks in close proximity to the inside wall 62 of the housing 12 as shown in the sectional view in FIG. 5. This feature precisely locates the terminals relative to the housing so that insertion and removal forces applied to the terminals by the components or harnesses are transferred directly to the housing and do not stress the solder connection or other terminal connections with the substrate. The cover 63 has holes to accomodate the terminal blades, and is mounted on the housing 12, as also shown in FIG. 1. The blades 44 of the terminals protrude through the cover to mate with female connectors 18 of wiring harnesses 16. Similarly holes in the main housing 12 aligned with the slots 48 of the bifurcated terminal portions admit male connectors of the relays 20 and fuses 22. Thus this configuration allows the harnesses 16 to directly connect to the power components 20 and 22 and to substrate conductors via the terminals.

Figure 7:
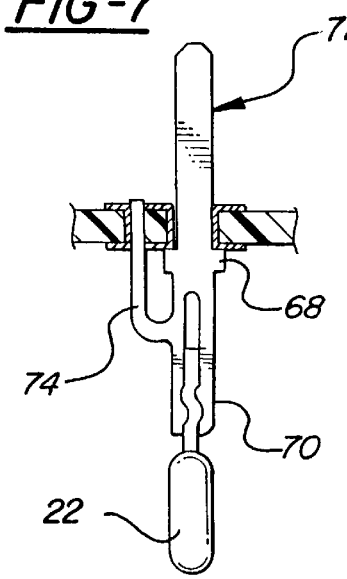
FIGS. 7–10 and 12–14 are isometric views of a variety of terminal styles for use with the module of the invention.
Figure 6:
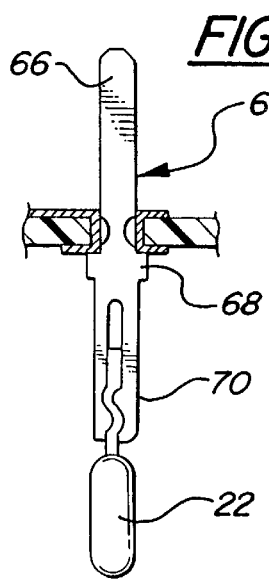
FIGS. 6 and 11 are side view of different terminal embodiments in a substrate in section.

In addition to the retention comb arrangement, a simpler assembly results by using terminals held in place by the substrate. One example is shown in FIG. 6 and comprises a terminal 64 having a blade 66 extending through a substrate hole, lateral wings 68 abut one surface of the substrate, and a bifurcated female portion 70, without hooks, in line with the blade extends in a direction opposite the blade. The wings 68, in addition to being a stop element, are also the connection links to adjacent terminals manufactured in a continuous strip. The substrate hole is plated through for electrical and mechanical connection to the terminal. The blade 66 is attached to the substrate by reflow soldering or the blade may comprise a compliant pin pressed into the hole. A component 22 is shown with a blade inserted in the female portion 70. The terminal 72 shown in FIG. 7 is like the terminal 64 of FIG. 6 except that the blade makes only a mechanical connection to the substrate and an outrigger 74 from the female portion 70 extends through an auxiliary plated-through hole in the substrate to make an electrical contact. If desired, the outrigger 74 may be bent into a plane normal to the plane of the blade.

Figure 8:
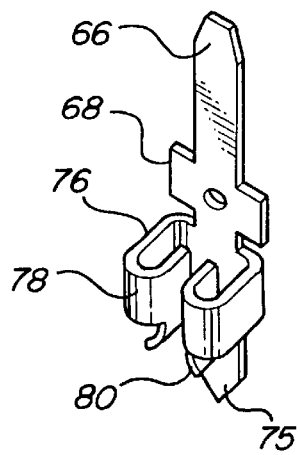
Figure 9:
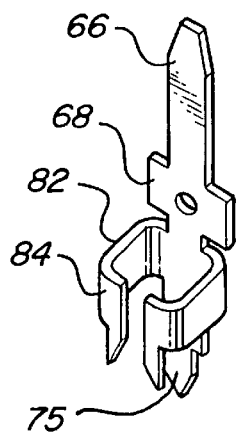
Figure 10:
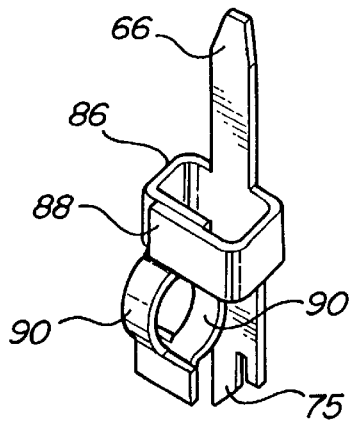

FIGS. 8–14 show terminal embodiments in which both male and female parts are located on the same side of the substrate. Each of these terminals has a narrow nib 75 on the end of the blade which extends into a substrate hole for electrical and mechanical attachment. The base of the blade adjacent the nib 75 affords a stop function. A female portion is formed adjacent the blade and a substrate aperture aligned with the female portion allows insertion of a component terminal. In FIG. 8, the female portion is a pair of arms 76 extending out of the plane of the blade 66 and with spaced ends 78 bent back toward that plane, defining a space or pocket for receiving a component blade. The lower edge of each end 78 has a flared out flange 80 to guide blade insertion. In FIG. 9 the female portion is a pair of arms 82 extending out of the plane of the blade 66 and with ends 84 turned toward each other, defining a space for receiving a component blade. The lower edge of each end 84 is beveled to guide blade insertion. In both FIGS. 8 and 9 embodiments, the component blade will lie in a plane perpendicular to the terminal blade 66. The wings 68 are only remnants of connector links but may be used to afford a stop function. FIG. 10 shows a terminal with a pair of arms 86 extending out of the plane of the blade 66 and with ends 88 turned toward each other and overlapping in a region spaced from the blade. Each end has a lower extension 90 which curves away from the other and curves back to define a slot spaced from and parallel to the plane of the blade 66 for receiving a component blade.

Figure 11:
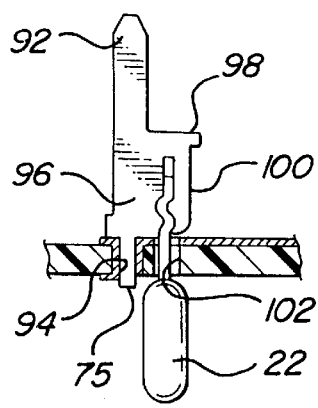
Figures 12, 13:
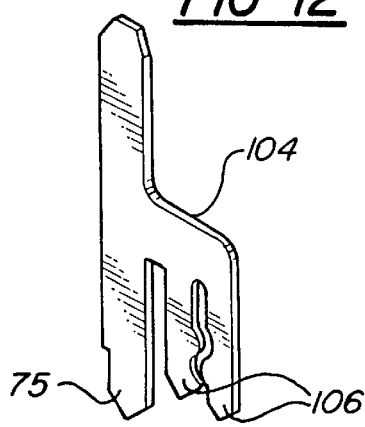
Figure 14:
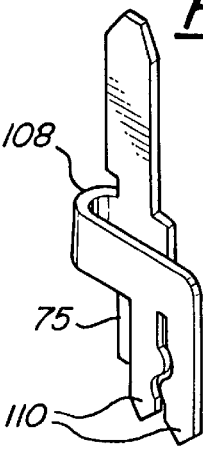

In FIG. 11, a terminal blade 92 on one side of the substrate has a narrow nib 75 which extends into a substrate hole 94 for electrical and mechanical attachment. The blade has a broadened base 96 nearest the substrate, and an outrigger 98 extends laterally from the blade and has a leg 100 extending alongside the base 96 to define a slot for receiving a blade of component 22. An aperture 102 aligned with the slot and spaced from the attachment hole admits the component blade from the opposite side of the substrate. The distance of the aperture 102 from the substrate attachment hole is determined by the lateral size of the broadened base 96. Alternatively, as in FIG. 12, the blade does not have a broadened base but an outrigger 104 that has a pair of spaced legs 106 which define a slot for insertion of a male terminal member. FIG. 13 shows a terminal like that of FIG. 12 but the outrigger 108 is bent to hold the legs 110 in a plane parallel to the blade. FIG. 14 is similar but the outrigger 112 holds the legs 114 in a plane perpendicular to the plane of the blade.

Figure 15A:
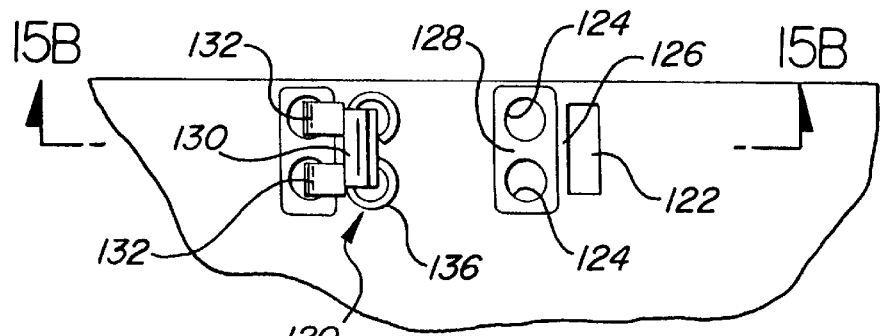
FIG. 15A is a top view of a substrate including a terminal according to the invention.
Figure 15B:
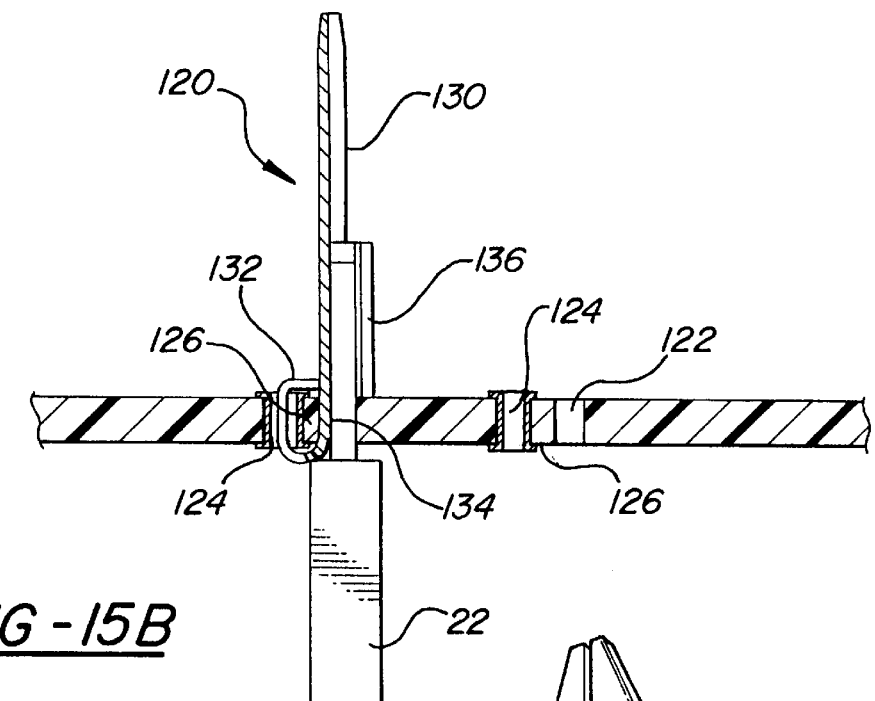
FIG. 15B is a cross section of the substrate taken along line 15B—15B of FIG. 15A and showing the terminal and a fuse inserted in the terminal.
Figure 15C:
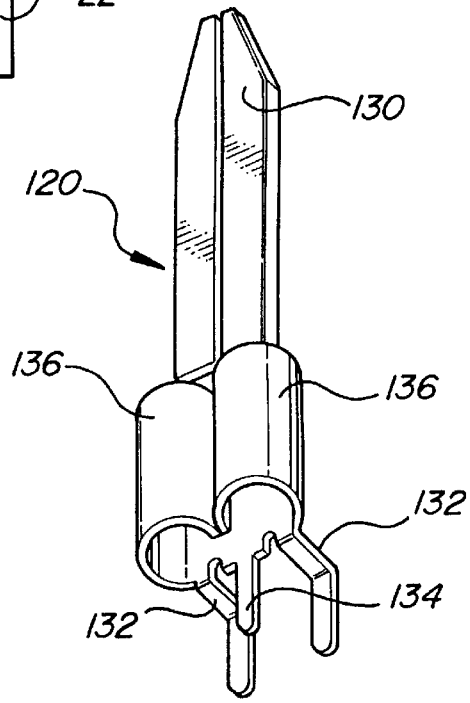
FIG. 15C is an isometric view of the terminal in FIG. 15B without crimps in its legs.

FIGS. 15A and 15B are top view and sectional side view of a terminal 120 and substrate along with a fuse 22, and 15C is an isometric view of the terminal (without crimps in its legs). For each terminal the substrate has a slot 122 spaced from a pair of round holes 124 to define a pair of thin webs 126 between the holes and the slot. A solder pad 128 is formed around the pair of holes 124 on both the top and bottom of the substrate. A blade 130 comprises material folded over to form a double thickness. The base of the blade 130 has a pair of tangs or legs 132 which extend through the holes 124 and are crimped around the webs 126 toward the slot 122 to secure the terminal to the substrate, and a solder connection is made to the solder pads 128. A third leg 134, between the legs 132, extends through the slot 122 and is crimped around the web toward the holes 124. An arm 136 extends laterally from each side of the base of the blade 130 and wraps around to the front of the base to meet the other arm, forming a pocket for receiving a blade of the fuse 22.

It will thus be seen that the circuit assembly combines power and electronic control circuits in a way that is economical to produce and minimizes package size by providing for harness connection opposite power component connection to economize on substrate area. In addition, by placing the electronic circuits on the same substrate with the power terminals an interconnection of separate substrates is avoided; supplemental power level conductors between power terminals interconnect selected large current regions, and ordinary circuit paths allow normal signal level interconnection throughout the remainder of the substrate.

The embodiments of the invention in which an exclusive property or privilege is claimed are defined as follows:

1. A circuit assembly for vehicle power and electronic circuits comprising:
    a single circuit board substrate having first and second sides, and including first and second sections with conductive paths in both of the first and second sections;
    electronic components and first terminals mounted on the first side of the substrate, and coupled to the conductive paths of said first section for carrying signal level currents;
    second terminals passing through the substrate and coupled to the conductive paths of said second section for carrying power level currents;
    supplemental power level conductors in said second section for selectively interconnecting at least some of said second terminals; and
    the second terminals including means at said first side of the substrate for coupling to a wiring harness that carries power level currents, and means at said second side of the substrate for coupling to power components that carry both power level currents and signal level currents.

2. A circuit assembly as defined in claim 1 wherein the second terminals each have a first connector portion accessible from said first side of the substrate and a second connector portion accessible from said second side of the substrate.

3. A circuit assembly as defined in claim 1 wherein the second terminals each have a male connector portion accessible from said first side of the substrate and a female connector portion accessible from said second side of the substrate.

4. A circuit assembly as defined in claim 1 wherein the second terminals each have a blade extending from said first side of the substrate and a bifurcated connector accessible from said second side of the substrate, whereby any terminal can be coupled to the wiring harness and/or to a power component.

5. A circuit assembly as defined in claim 1 wherein the second terminals each have a blade extending from said first side of the substrate and a bifurcated connector extending from said second side of the substrate, whereby any terminal can be coupled to a conductor on the substrate, the wiring harness and/or to a power component.

6. A circuit assembly as defined in claim 1 wherein the second terminals each have a blade extending from said first side of the substrate and a female connector on said first side of the substrate and accessible from said second side of the substrate via an aperture in the substrate, whereby any terminal can be coupled to a conductor on the substrate, the wiring harness and/or to a power component.

7. A circuit assembly as defined in claim 1 wherein the second terminals each have a blade extending from said first side of the substrate and a female connector on said first side of the substrate and accessible from said second side of the substrate via an aperture in the substrate;
    the female connector including a pair of arms extending laterally from opposite edges of the blade and curved toward each other to form a pocket between the arms and the blade, the pocket being aligned with the aperture in the substrate.

8. A circuit assembly as defined in claim 1 wherein the second terminals each have a blade extending from said first side of the substrate and a female connector on said first side of the substrate and accessible from said second side of the substrate via an aperture in the substrate;
    the female connector including a pair of arms extending laterally from opposite edges of the blade and curved toward each other to form a pocket between the arms and the blade, the pocket being aligned with the aperture in the substrate; and
    a pair of tabs extend from the blade adjacent the substrate and are crimped to the substrate to fasten the terminal to the substrate.

9. A circuit assembly as defined in claim 1 wherein the second terminals each have a blade extending from said first side of the substrate and a female connector on said first side of the substrate and accessible from said second side of the substrate via an aperture in the substrate;
    the female connector including a pair of arms extending laterally from opposite edges of the blade and curved toward each other to overlap at a region spaced from the blade; and
    extensions from the arms in the region of overlap extending generally perpendicular to the substrate and spaced to form a pocket aligned with the aperture in the substrate.

10. A circuit assembly as defined in claim 1 wherein the second terminals each have a blade extending from said first side of the substrate and a female connector on said first side of the substrate and accessible from said second side of the substrate via an aperture in the substrate;
    the female connector including a pair of lateral arms extending out of the plane of the blade and turned toward each other, defining a pocket at one side of the blade for receiving a male connector in a plane normal to the plane of the blade.

11. A circuit assembly as defined in claim 1 wherein the second terminals each have a blade extending from said first side of the substrate and a female connector on said first side of the substrate and accessible from said second side of the substrate via an aperture in the substrate;
    the female connector including an outrigger extending laterally from an edge of the blade and supporting a leg parallel to and spaced from the edge of the blade to define a slot for receiving a male connector, the slot being aligned with the aperture in the substrate.

12. A circuit assembly as defined in claim 1 wherein the second terminals each have a blade extending from said first side of the substrate and a female connector on said first side of the substrate and accessible from said second side of the substrate via an aperture in the substrate;
    the female connector including an outrigger extending laterally from an edge of the blade and supporting a pair of spaced legs parallel to the blade to define a slot between the legs for receiving a male connector, the slot being aligned with the aperture in the substrate.

13. A circuit assembly as defined in claim 1 wherein the second terminals each have a blade extending from said first side of the substrate and a female connector on said first side of the substrate and accessible from said second side of the substrate via an aperture in the substrate;

the female connector including an outrigger extending laterally from an edge of the blade and bent out of the plane of the blade, the outrigger supporting a pair of spaced legs parallel to the blade to define a slot between the legs for receiving a male connector, the slot being aligned with the aperture in the substrate.

14. A circuit assembly as defined in claim 1 including:

bifurcated blades extending from the substrate for connection to power components and having hook elements extending laterally outward from the blades;

a housing for the assembly;

the housing having retention webs between the bifurcated blades adjacent the second section;

a set of apertures in the webs between adjacent bifurcated blades;

retention elements in the apertures between adjacent blades for engaging the hook elements to absorb axial force on the second terminals, thereby preventing stress on the connections on the substrate.

15. A circuit assembly as defined in claim 1 including:

bifurcated blades extending from the substrate for connection to power components and having hook elements extending laterally outward from the blades at the blade extremity;

a housing for the assembly having an inner wall abutting the bifurcated blade extremities;

the housing having retention webs adjacent the second section;

a set of apertures in the matrix aligned with spaces between the blades;

a retention comb having teeth extending through the set of apertures between adjacent blades for engaging the hook elements to trap the blade extremities between the teeth and the wall and thereby absorb axial force on the second terminals to prevent stressing connections on the substrate.

* * * * *